United States Patent [19]

Maruyama et al.

[11] Patent Number: 4,831,584
[45] Date of Patent: May 16, 1989

[54] BLOCH LINE MEMORY DEVICE
[75] Inventors: Youji Maruyama; Ryo Suzuki, both of Hachioji, Japan
[73] Assignee: Hitachi, Ltd., Tokyo, Japan
[21] Appl. No.: 76,215
[22] Filed: Jul. 22, 1987
[30] Foreign Application Priority Data
Jul. 25, 1986 [JP] Japan ................... 61-173651
[51] Int. Cl.$^4$ ............................. G11C 19/08
[52] U.S. Cl. ......................... 365/29; 365/87
[58] Field of Search ............... 365/87, 171, 29
[56] References Cited
U.S. PATENT DOCUMENTS
4,199,819 4/1980 Schwee et al. ............. 365/87

Primary Examiner—James W. Moffitt
Attorney, Agent, or Firm—Antonelli, Terry & Wands

[57] ABSTRACT

A Bloch line memory device in which a stripe magnetic domain is formed within a magnetic film for holding magnetic bubble domains, and Bloch line pairs are stored as information carriers within a magnetic wall defining the magnetic domain. In order to write Bloch lines into the magnetic wall of the stripe magnetic domain, current is caused to flow through a single conductor which is so disposed as to cross the magnetic wall of the stripe magnetic domain. On this occasion, the current through the single conductor is so directed as to generate an in-plane field opposite in sense to magnetization within the magnetic wall of the stripe magnetic domain.

9 Claims, 8 Drawing Sheets

BLOCH LINE MEMORY DEVICE

BACKGROUND OF THE INVENTION

1. Field of the Invention

The present invention relates to a Bloch line memory device, and more particularly to a writing system for the information carriers of a Bloch line memory device.

2. Description of the Related Art

Figure 1:
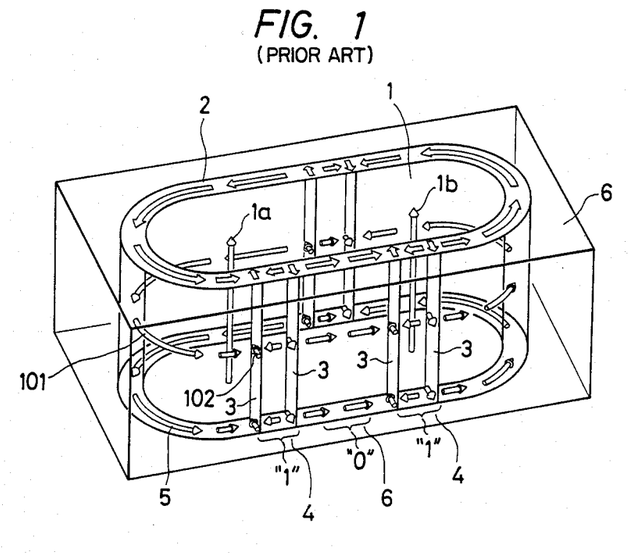
FIG. 1 is a diagram showing a stripe magnetic domain and Bloch lines existent within the magnetic wall thereof.

The Bloch line memory device uses a magnetic garnet film as a memory medium film likewise to a magnetic bubble memory device. The storing systems of both the memory devices, however, differ greatly That is, in the conventional magnetic bubble memory device, the presence or absence of a bubble domain corresponds to information "1" or "0," whereas in the Bloch line memory device, the presence or absence of a vertical Bloch line pair which exists within a magnetic wall around a stripe magnetic domain generated by stretching a bubble domain corresponds to 1" or "0." FIG. 1 illustrates this situation. In the figure, upward arrows 1a and 1b in a stripe magnetic domain 1 indicate the senses of magnetization in the stripe magnetic domain 1, an arrow 101 on the center line of a magnetic wall 2 indicates the sense of the magnetization of the center line of the magnetic wall 2, and an arrow 102 vertical to the center line of the magnetic wall 2 indicates the sense of the magnetization of the center of a vertical Bloch line 3 (hereinbelow, simply called "Bloch line"). A part 4 where the Bloch lines 3 exist in a pair corresponds to the information "1," while a part 6 where they do not exist corresponds to the information "0."

The expression "Bloch line" for an information carrier signifies a fine magnetization structure which exists within the magnetic wall 2 surrounding the stripe magnetic domain 1. The Bloch line 3 can stably exist within the magnetic wall 2, and can freely move within the magnetic wall 2. Accordingly, when the stripe magnetic domains 1 in a large number are arranged in parallel at predetermined positions so as to include the Bloch lines 3 within the magnetic walls thereof, they behave just as the bubble domain which moves within the minor loop of the magnetic bubble memory device. Thus, the Bloch line memory device can take a memory device arrangement of the shift register type similarly to the magnetic bubble device.

The existence of the Bloch line has been known for long, and it has been verified by experiments and the analyses thereof that the moving speed of the magnetic domain lowers due to the existence of the Bloch line. Accordingly, in the magnetic bubble memory device wherein the magnetic domain must be moved, contrivances have been made for preventing the generation of the bubble domain containing the Bloch line, namely, the so-called "hard bubble." In contrast, in the Bloch line memory device, the existence of the Bloch line is positively utilized.

The physical size of the Bloch line is about 1/10 of the width of the stripe magnetic domain where the Bloch line exists, and a large number of Bloch lines can be caused to exist in a single stripe magnetic domain. For example, in case of a magnetic garnet film which has presently been developed for the magnetic bubble memory device and whose stripe magnetic domain has a width of 1 $\mu$m, approximately $5 \times 10^6$ Bloch lines can be caused to exist per $cm^2$. Accordingly, in the case where the two paired lines are used as the information carrier, a memory device of 256 Mbits/$cm^2$-class can be fabricated.

Besides the minute size, the Bloch line has a ground permitting such a large capacity. More specifically, whereas the magnetic bubble memory propagates the information carrier by rotating an in-plane field, the Bloch line memory employs a perpendicular field for the propagation of information. Therefore, the propagation track pattern of the Bloch line memory is simple in plan, and this fact facilitates the heightened density of the device.

As stated above, the Bloch lines can store information while freely turning around the stripe magnetic domain. In order to construct the memory device, however, writing and reading information must be realized.

As regards the writing, there has been generally known a system wherein current is caused to flow through a conductor arranged at an end part of a stripe magnetic domain, to bestow a local magnetic field on the end part of the stripe magnetic domain and to invert magnetization by 180°, thereby to write information. It may be considered that the magnetized state indicated by "0" in FIG. 1 is inverted into the state of the region "1." On this occasion, the magnetization changes continuously at the boundary between the inverted region and the noninverted region, so that a state changing by 90° with respect to the magnetic wall can be established. This corresponds to the Bloch lines. Incidentally, since this state is necessarily established with the two Bloch lines forming a pair, the information is caused to correspond to the presence or absence of one pair of Bloch lines.

Figure 2A:
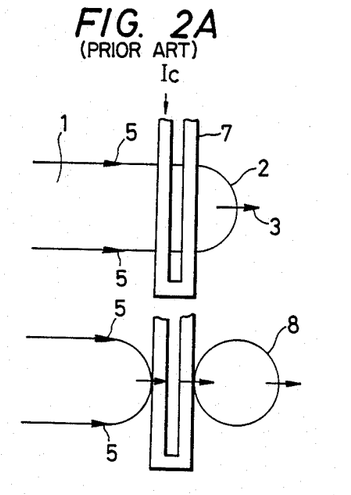
FIGS. 2A and 2B are diagrams for explaining a known principle on which the presence or absence of a Bloch line is converted into the presence or absence of a magnetic bubble domain.
Figure 2B:
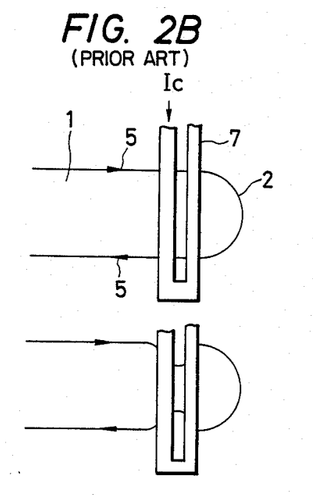

Information is read out after the presence of the Bloch lines is converted into the presence or absence of a bubble domain. The conversion from the Bloch lines into the bubble domain is resorted to a method which is reported by KONISHI in "IEEE Trans., MAG-19," No. 5 (1983), pp. 1838–1843. This method will be explained with reference to FIGS. 2A and 2B. When Bloch lines 3 exist within the magnetic all 2 of a stripe magnetic domain 1, the sense of magnetization within the magnetic wall 2 is inverted with the boundary at the Bloch lines 3. Owing to such a change in the structure of the domain wall, easiness in the chopping of the end part of the magnetic domain 1 becomes different between in a case where one Bloch line 3 has moved to the end part of the stripe magnetic domain 1 as illustrated in FIG. 2A and in a case where no Bloch line exists at the end part of the stripe magnetic domain 1 as illustrated in FIG. 2B. Thus, only in the case where the single Bloch line 3 exists at the end part of the stripe magnetic domain 1 as in FIG. 2A, a predetermined current is caused to flow through a chopping conductor 7 disposed in the vicinity of the end part of the stripe magnetic domain 1, whereby a bubble domain 8 can be chopped from the end part of the stripe magnetic domain 1. On the other hand, in the case where the Bloch line 3 does not exist at the end part of the stripe magnetic domain 1 as in FIG. 2B, the bubble domain cannot be chopped even when the current is caused to flow through the chopping conductor 7. The bubble domain 8 chopped in FIG. 2A is propagated by an expedient similar to the major line of the bubble memory device, and is converted into an electric signal. Then, the presence of the Bloch line can be read out.

By fabricating portions for the above writing, storing and reading functions on an identical device, the Bloch line memory device can be realized.

The writing and reading stated above are described in U.S. Pat. No. 4,583,200.

A magnetic storing method wherein the magnetized state of a stripe magnetic domain is set at S=0 (the state in which two Bloch lines exist), is also described in U.S. Pat. No. 4,583,200. Now, this method will be briefly explained with reference to FIGS. 3A-3D.

Figure 3A:
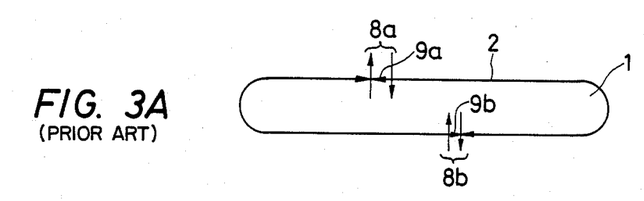
FIGS. 3A thru 3D are diagrams for explaining the relationship between Bloch line pairs and an in-plane field, and the stable retention of the Bloch line pairs at predetermined positions.
Figure 3B:
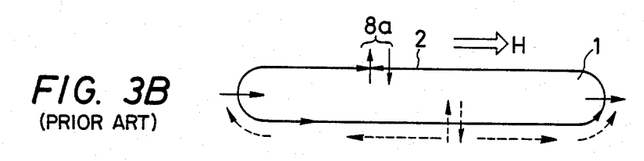
Figure 3C:
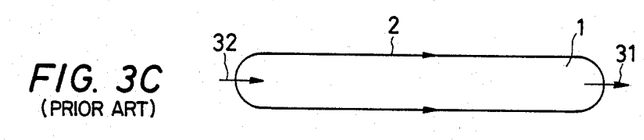
Figure 3D:
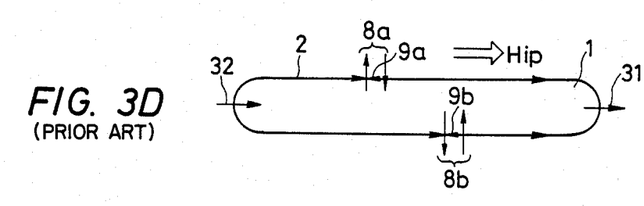

FIG. 3A illustrates a state in which two pairs of Bloch lines 8a and 8b exist within a magnetic wall 2 around a single stripe magnetic domain 1. The senses 9a and 9b of magnetization are opposite to each other between the Bloch line pairs 8a and 8b. The reason is that, as seen from FIG. 1, the magnetization rotates continuously along the magnetic wall. Under this state, a magnetic field H in the same direction as the sense of magnetization 9b in the Bloch line pair 8b in FIG. 3A is applied. Then, the pair of Bloch lines 8b are separated to move to both the ends of the stripe magnetic doamin 1 Consequently, information possessed by the Bloch line pair 8b disappears (FIG. 3B). As an expedient preventive of this drawback, there has been considered a measure of improvement in which one Bloch line 31 or 32 is inserted at each end of the stripe magnetic domain 1 (FIG. 3C). When an in-plane field $H_{ip}$ is applied with the Bloch lines 31 and 32 existing at both the ends of the stripe magnetic domain 1 as shown in FIG. 3C, the senses of the magnetization of the stripe magnetic domain 1 become the same as the direction of the in-plane field $H_{ip}$ on both the upper and lower sides in the drawing, and hence, the Bloch lines 31 and 32 can stably exist at the end parts. When, under this state, the Bloch line pairs 8a and 8b are written, the senses of magnetization 9a and 9b between the Bloch line pairs are reversed to the in-plane field $H_{ip}$ by the continuity of the direction of the magnetization stated above (FIG. 3D). Therefore, whether the Bloch line pair exists on the upper side or the lower side of the magnetic wall 2, it can stably exist without separating.

Figure 4A:
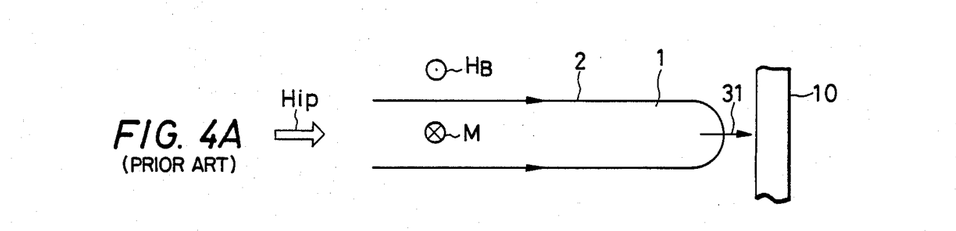
FIGS. 4A thru 4D are diagrams showing a system for writing Bloch line pairs in a prior art.

Next, a prior-art system for writing Bloch lines will be described. FIG. 4A is a diagram showing the right-side part of FIG. 3C. In the illustration of FIG. 4A, a bias field $H_B$ is applied perpendicularly to the sheet of the drawing. Besides, a Bloch line 31 is caused to exist at the end part of a stripe magnetic domain 1 in order that the magnetization of a magnetic wall 2 may entirely become identical in direction to an applied in-plane field $H_{ip}$.

Figure 4B:
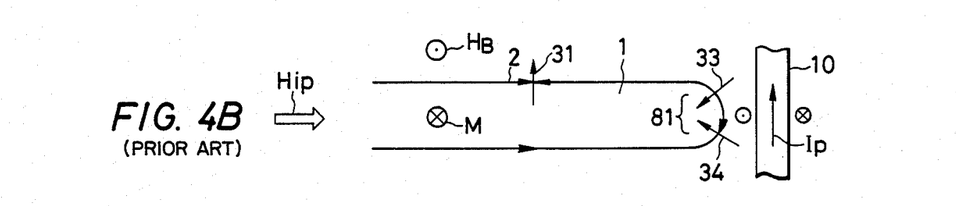

In performing a writing operation, first of all, the Bloch line 31 is moved counterclockwise as shown in FIG. 4B. Subsequently, a pulse current $I_p$ is caused to flow through a conductor 10 so as to form a Bloch line pair 81. The Bloch line pair 81 consists of Bloch lines 33 and 34. The magnetization directions of the Bloch line pair 81 infallibly become the same owing to the continuity of magnetization. The Bloch lines of equal magnetization directions are annihilated when combined. Under this condition, therefore, they do not form an information carrier.

Figure 4C:
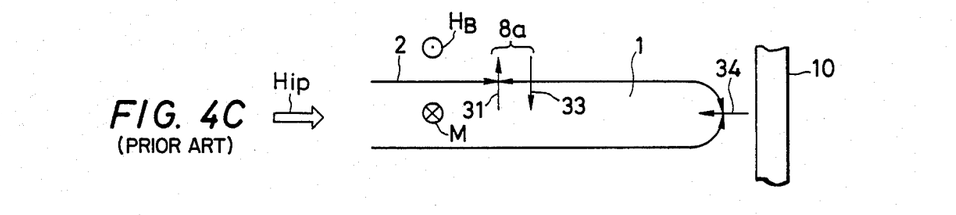

In order to solve this drawback, the previously existing Bloch line 31 is paired with the Bloch line 33 as indicated at symbol 8a in FIG. 4C, and the pair 8a is used as the information carrier. In this case, it is an indispensable requirement that the directions of the magnetizations of the previously existing Bloch line 31 and the Bloch line 33 are opposite to each other. This requirement may be met in such a way that the polarity of the pulse current $I_p$ to flow through the conductor 10 is properly selected so as to control the directions of magnetization of the Bloch line pair 81.

Figure 4D:
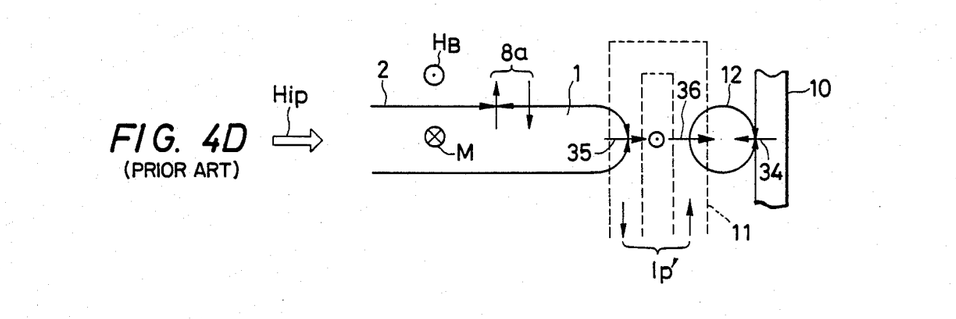

Meanwhile, under the state of FIG. 4C, the Bloch line 34 the magnetization direction of which differs by 180° from that of the Bloch line 31 in the initial state is left behind at the end part of the stripe magnetic domain 1. In order to change the Bloch line 34 into the Bloch line 31 in the initial state, as illustrated in FIG. 4D, the end part of the stripe magnetic domain 1 needs to be chopped as a magnetic domain 12 by causing current $I_p'$ to flow through a hairpin conductor 11. Owing to this chopping operation, a Bloch line 35 having the same magnetization direction as in the initial state is formed at the end part of the stripe magnetic domain 1 nearer to the Bloch line pair 8a written for the information carrier.

As described above, the writing system of the prior art Bloch line memory is materialized broadly by the three steps (FIGS. 4B, 4C and 4D).

That is, the first step is the movement of the Bloch line 31 at the front end, the second step is the formation of the Bloch line pair 81, and the third step is the chopping of the magnetic domain 12 for replacing the Bloch line 34 at the front end with the Bloch line 35 in the initial state. Since, in this manner, the prior art has required the complicated operation for the writing of information, it has been difficult to drive the memory device at high speed.

SUMMARY OF THE INVENTION

An object of the present invention is to provide a Bloch line memory device into which information can be written at high speed and by a single step.

A Bloch line memory device according to the present invention comprises a magnetic film which holds magnetic bubble domains; a stripe magnetic domain which is formed within said magnetic film, and which has Bloch line pairs as information carriers; a single conductor which is disposed on said magnetic film so as to cross a magnetic wall of said stripe magnetic domain; and means for causing current to flow through said single conductor so as to establish an in-plane field in a sense opposite to that of magnetization in said magnetic wall of said stripe magnetic domain, thereby to write the Bloch line pair into said magnetic wall of said stripe magnetic domain.

When a pulse current is caused to flow through the writing conductor which overlaps the stripe magnetic domain, magnetic fields of opposite senses are generated on the right and left of the conductor, and hence, two pairs of Bloch lines whose magnetization directions differ by 180° (the magnetization directions of the identical pair of Bloch lines are the same) are written into the magnetic wall. Further, an intense in-plane field from the conductor is applied just under the conductor, namely, between the two pairs of Bloch lines. The microstructure of a domain wall, which is called a "Bloch point," is formed just under the conductor by the in-plane field.

Owing to the injection of the Bloch point, one line in each of the Bloch line pairs existing on the right and left is annihilated. Two Bloch lines whose magnetization directions differ by 180° are left behind by this phenomenon. They are used as the information carrier, whereby the writing of the Bloch line memory is performed.

According to the present invention, in writing information into the Bloch line memory, the steps of moving a Bloch line at a front end and chopping a magnetic domain are dispensed with. Thus, it has been permitted to greatly simplify the writing operation. Concretely, a period of time necessary for the writing has been shortened to 1 μsec. Moreover, it has been permitted to decrease the number of the conductors of a writing function portion from four to one.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

Now, embodiments of the present invention will be described with reference to the drawings.

Figure 5A:
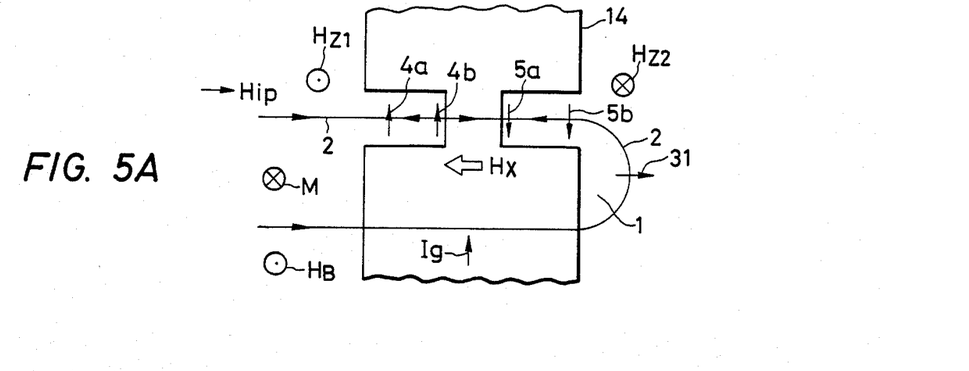
FIGS. 5A thru 5C are diagrams showing a writing system in an embodiment of the present invention.
Figure 5B:
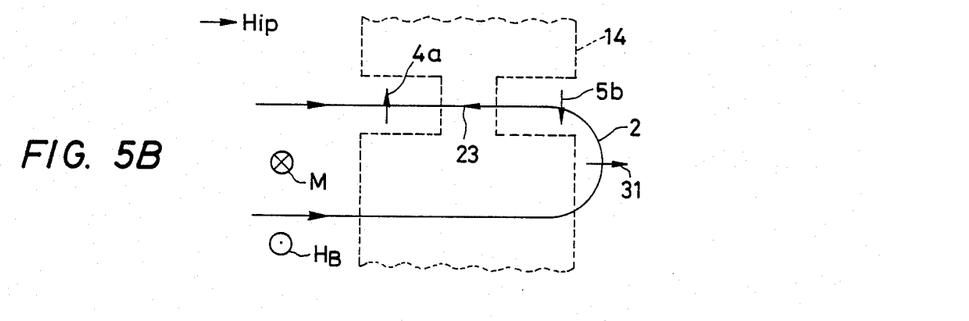
Figure 5C:
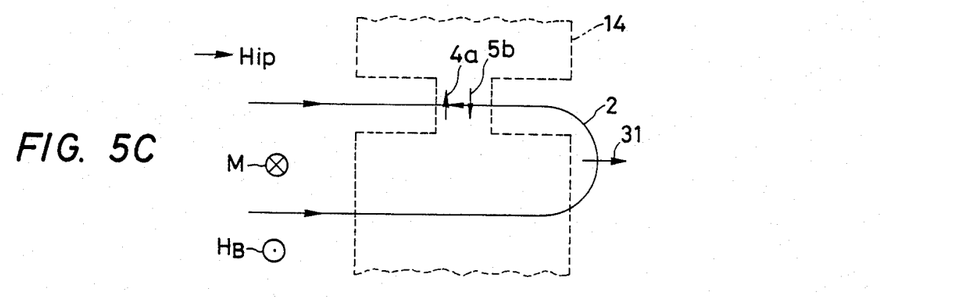

FIGS. 5A thru 5C show a stripe magnetic domain 1, and a writing conductor 14 which overlaps it. The stripe magnetic domain 1 is presumed to have been generated in a perpendicularly magnetized garnet film having a stripe width of 5 μm and exhibiting 4 $\rho M_s = 200$ G or so. In order to perform writing into the upper side of a magnetic wall 2 as viewed in the drawing, the writing conductor 14 is narrowed at a selected part. The width of this part is about 3 μm.

When a current $I_g$ is caused to flow through the writing conductor 14, a magnetic field $H_{z1}$ perpendicular to the sheet of the drawing is generated on the left side of the conductor 14. Owing to the magnetic field $H_{z1}$, Bloch lines 4a and 4b are formed in the left part of the magnetic wall 2 of the stripe magnetic domain 1. Contrariwise, a magnetic field $H_{z2}$ opposite in sense to the magnetic field $H_{z1}$ is applied to the right side of the conductor 14, so that Bloch lines 5a and 5b differing in sense from the Bloch lines 4a and 4b by 180° are formed in the right part of the magnetic wall 2. Such states are illustrated in three dimensions in FIGS. 6A and 6B.

Figure 6A:
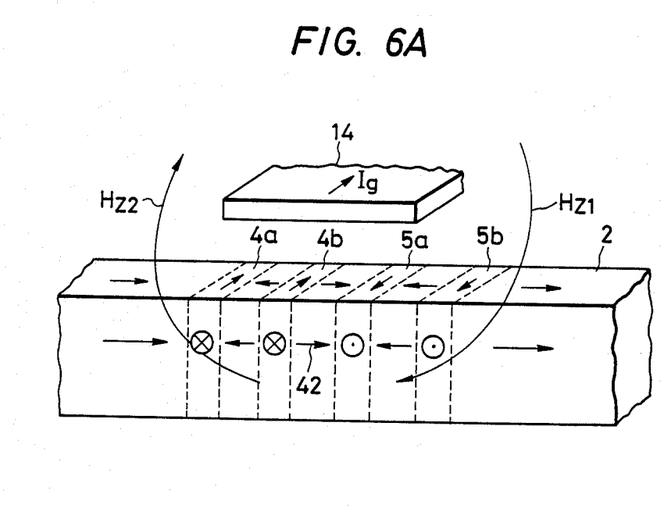
FIGS. 6A and 6B are diagrams showing tee principle of writing in FIGS. 5A thru 5C in three-dimensional fashion.
Figure 6B:
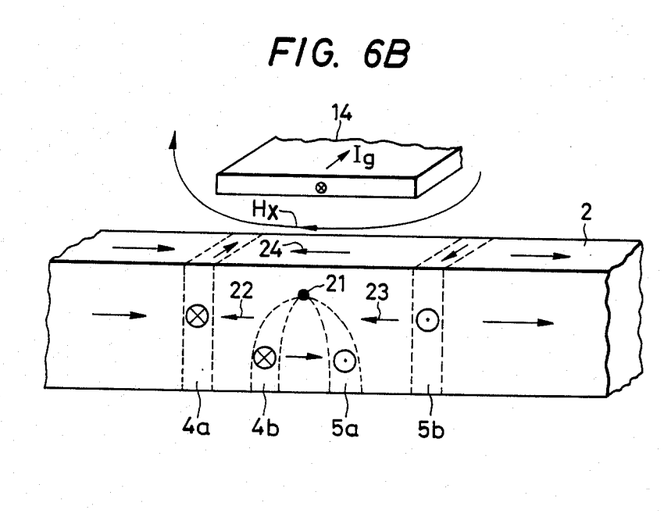

FIG. 6A shows in model fashion the upper side of the magnetic wall 2 in which the four Bloch lines 4a, 4b and 5a, 5b have been written. Arrows in the figure indicate the senses of the magnetizations of corresponding regions. Since the current $I_g$ is flowing through the conductor 14, an in-plane field $H_x$ is generated along with the magnetic fields $H_{z1}$ and $H_{z2}$ (the fields having formed the Bloch lines) as shown in FIG. 6B. The in-plane field $H_x$ is the intensest at the upper surface of the magnetic garnet film, and when the current $I_g$ is set to 10 mA or above, the in-plane field $H_x$ acts to turn the magnetizations into the same direction as that of this in-plane field.

Therefore, the magnetization 42 of the region between the Bloch lines 4b and 5a is inverted by 180°, with the result that a Bloch point 21 is formed.

The existence of the Bloch point 21 has been well known, and it has already been known that the Bloch point is formed by the intense in-plane field $H_x$. This Bloch point 21 unites the Bloch lines 4b and 5a as illustrated in FIG. 6B, and then moves downwards. As a result, the directions 22, 23 and 24 of the magnetizations of the regions between the Bloch lines 4a and 5b become identical to the direction of the in-plane field $H_x$. Owing to this phenomenon, the Bloch lines 4b and 5a are annihilated, and the Bloch lines 4a and 5b are left behind.

This state is shown in FIG. 5B.

Thereafter, the current $I_g$ of the conductor 14 is cut off. Then, the magnetization 23 between the Bloch lines 4a and 5b is tightened by an applied in-plane field $H_{ip}$, and the Bloch lines 4a and 5b come to exist just under the conductor 14 (FIG. 5C). Since the Bloch lines 4a and 5b have the magnetization directions differing by 180°, they form a Bloch line pair (an information carrier).

According to the embodiment described above, the step of moving a front-end Bloch line 31 and the step of chopping a magnetic domain after the formation of the Bloch line pair in order to establish an initial state are dispensed with. That is, the writing system of the Bloch line memory in the prior art can be greatly simplified.

The embodiment of FIGS. 5A–5C has been described as to the case of writing the Bloch line pair into the upper side of the magnetic wall 2. In case of writing a Bloch line pair into the lower side of the magnetic wall, the narrower part of the conductor 10 may be arranged on the lower side of the magnetic wall 2.

The above embodiment has been explained on the method of writing the Bloch line pair into a predetermined position of the magnetic wall 2 which surrounds the stripe magnetic domain 1. In this method, the partly narrowed conductor has been employed as means for selecting the predetermined writing position. The means utilizes a mechanism in which, since the narrower part of the conductor has a higher current density and undergoes a locally higher field intensity, the Bloch point is injected just under the part so as to form the Bloch line pair.

In the next embodiment, there will be described a method in which the propriety of writing based on the relationship between an in-plane field generated by a writing conductor and the sense of the magnetization of a magnetic wall is utilized as the means for selecting the writing position.

Figure 7A:
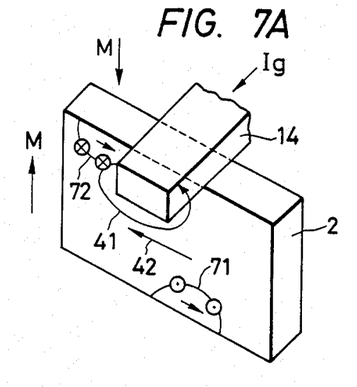
FIGS. 7A thru 7F are diagrams showing a magnetic wall and a writing conductor in three-dimensional fashion in order to elucidate the difference of writing mechanisms.
Figure 7B:
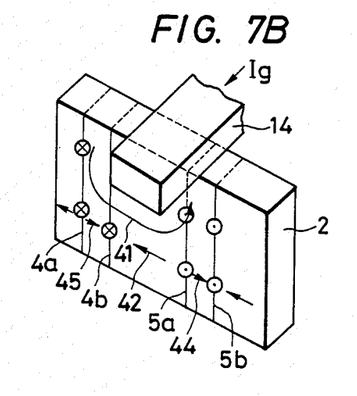
Figure 7C:
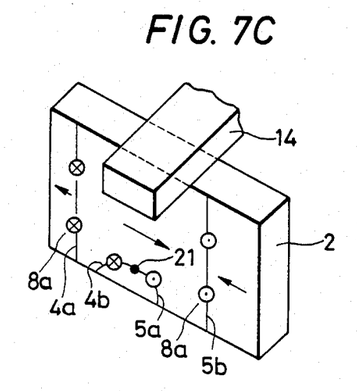
Figure 7D:
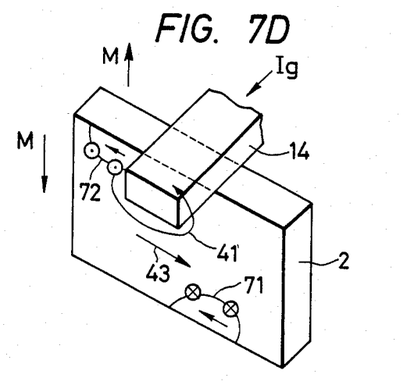
Figure 7E:
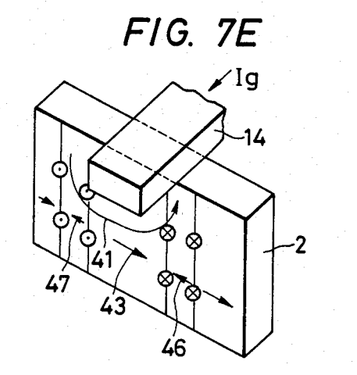
Figure 7F:
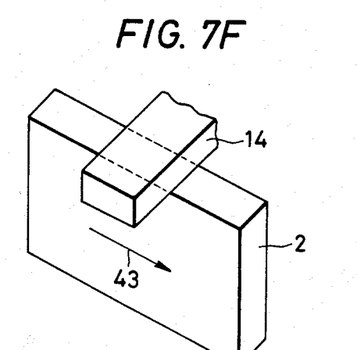

FIGS. 7A thru 7F are diagrams showing a magnetic wall 2 and a writing conductor 14 in three dimensions. Among them, FIGS. 7A thru 7C illustrate a case where the sense of the magnetization 42 of the magnetic wall 2 is opposite to that of an in-plane field 41 generated by the writing conductor 14, and FIGS. 7D thru 7F illustrate a case where both the senses are identical. Now, the difference of writing mechanisms will be explained.

The magnetic field 41 established by the writing conductor 14 forms horizontal Bloch lines 71 and 72 within the parts of the magnetic wall 2 near the conductor. If the magnetic field 41 is higher than a predetermined intensity, the horizontal Bloch lines 71 and 72 move in the directions of the thickness of a magnetic film and form four Bloch lines 4a, 4b, 5a and 5b shown in FIG. 7B. The senses of the magnetizations 44 and 45 of wall regions sandwiched between the pair of Bloch lines 4a and 4b and between the pair of Bloch lines 5a and 5b are identical to the sense of the magnetic field 41, so that the regions of the magnetizations 44 and 45 are expanded As a result, the region of the magnetization 42 is contracted. Further, the magnetization 42 and the magnetic field 41 are in anti-parallel relationship, so that the magnetizations give rise to cap-switching, and a Bloch point 21 is injected. Consequently, the inner ones 4b and 5a of the four Bloch lines 4a, 4b, 5a and 5b joining to the Bloch point 21 are annihilated as illustrated in FIG. 7C. Then, only the Bloch lines 4a and 5b are left behind. Since the remaining Bloch lines 4a and 5b differ in the direction of magnetization from each other, they form a Bloch line pair 8a.

On the other hand, in the case of FIGS. 7D thru 7F where the magnetic field 41 generated by the writing conductor 14 and the magnetization 43 of the magnetic wall 2 are in the same direction, four Bloch lines are formed as in FIG. 7B by a writing current $I_g$ (FIG. 7E). Since, however, the senses of the magnetization 43 and the magnetic field 41 are identical, the cap-switching does not take place, and the Bloch point is not inserted. In addition, the senses of the magnetizations 46 and 47 of regions held in the respective pairs of Bloch lines generated are opposite to the sense of the in-plane field 41, so that the regions of the magnetizations 46 and 47 are narrowed. As a result, the generated Bloch lines are united with each other (the Bloch lines belonging to the same pair are combined) and are annihilated. Therefore, any Bloch line pair is not left behind and is not written (FIG. 7F).

Writing methods which utilize the above principle are illustrated in FIGS. 8A–8 and FIGS. 9A–9D.

Figure 8A:
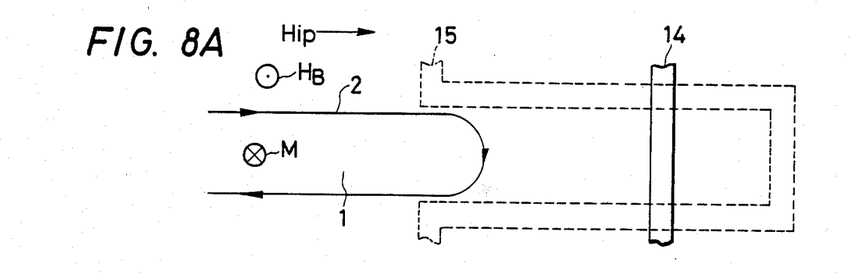
FIGS. 8A thru 8D and FIGS. 9A thru 9D are diagrams showing writing systems in other embodiments of the present invention.
Figure 8B:
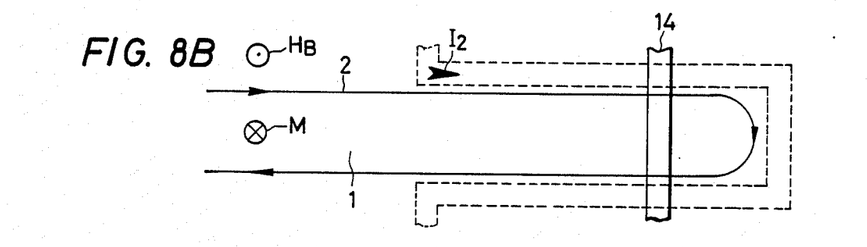
Figure 8C:
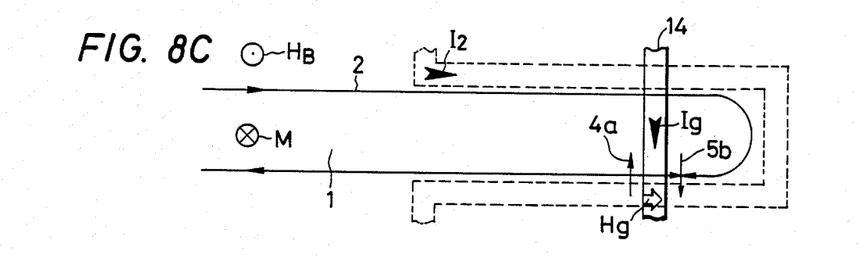
Figure 8D:
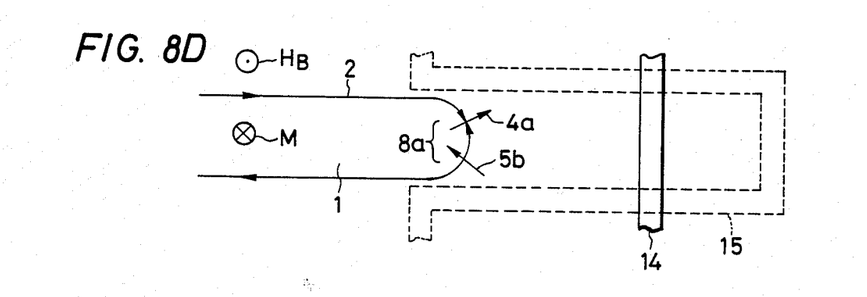

FIGS. 8A thru 8D show a stripe magnetic domain 1, a writing conductor 14, and a conductor 15 for controlling the position of the stripe magnetic domain 1. The senses of magnetization of a magnetic wall 2 are opposite on the upper and lower sides of the stripe magnetic domain 1. In order to perform a writing operation, the stripe magnetic domain 1 in the state of FIG. 8A is stretched under the writing conductor 14 as shown in FIG. 8B. In the present embodiment, a current $I_2$ is caused to flow through the conductor 15 so as to apply a perpendicular magnetic field having the same direction as that of the magnetization of the stripe magnetic domain 1 to the end part of this stripe magnetic domain. The stripe magnetic domain 1 may well be stretched by another method, for example, employing a conductor of different shape or slightly lowering the intensity of a biasing perpendicular field $H_B$. Thereafter, a pulse current $I_g$ is caused to flow through the writing conductor 14 as shown in FIG. 8C. Owing to a magnetic field $H_g$ this generated, Bloch lines 4a and 5b are written into the magnetic wall 2 (in the embodiment, the lower side of the magnetic wall) whose magnetization has the opposite sense to the magnetic field $H_g$. Subsequently, the current $I_2$ is cut off to restore the stripe magnetic domain 1 into the initial state. Then, the writing ends as depicted in FIG. 8D.

The present embodiment has been explained as to the case where the writing conductor 14 and the stripe magnetic domain 1 are set apart. This system is applicable to an expedient in which information is written by exploiting a quasi-static repulsive force between a bubble domain and the stripe magnetic domain. More specifically, a magnetic bubble is caused to exist on the conductor 15 corresponding to stripe magnetic domain not to have a Bloch line pair written thereinto, by the use of predetermined means. Then, even when current is conducted through the conductor 15, the stripe magnetic domain cannot stretch under the writing conductor 14. Therefore, the writing is not performed.

A Bloch line pair 8a to serve as an information carrier is written by the foregoing embodiment.

Figure 9A:
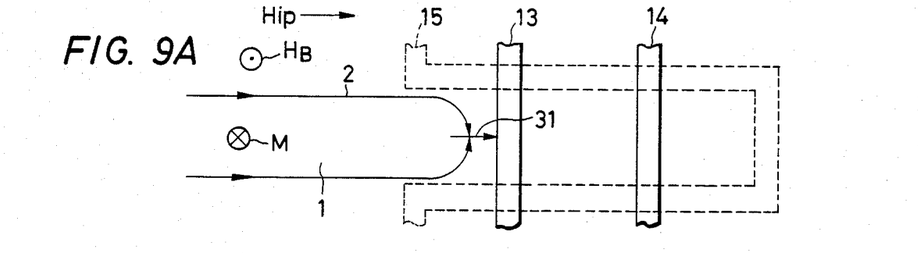
Figure 9B:
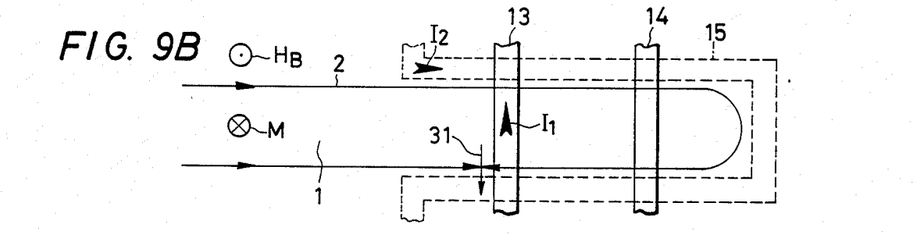
Figure 9C:
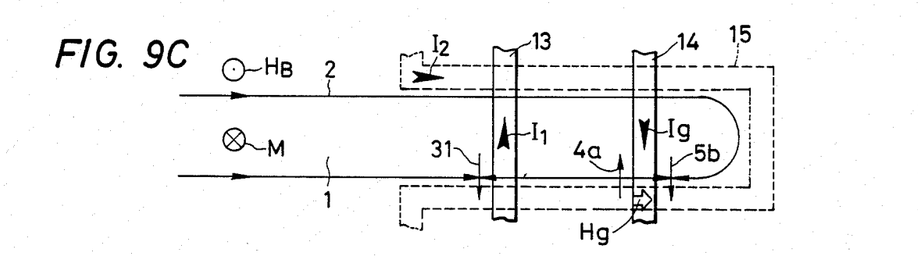
Figure 9D:
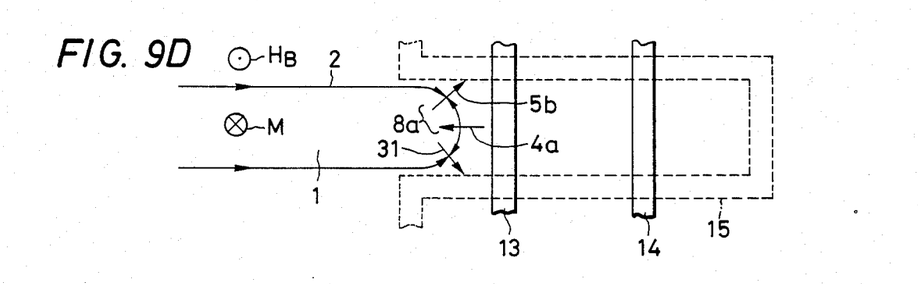

In the embodiment of FIGS. 8A–8D, the directions of magnetization at the end part of the stripe magnetic domain before the writing operation are in anti-parallel relationship between in the upper and lower sides of the magnetic domain. On the other hand, in the case where the directions of magnetization are identical as illustrated in FIGS. 9A thru 9D, a conductor 13 is added anew, whereby the writing can be effected as in the case of FIGS. 8A thru 8D. In the embodiment of FIGS. 9A–9D, immediately before stretching a stripe magnetic domain 1, a current $I_1$ is caused to flow through the conductor 13 so as to locally generate an in-plane field opposite in sense to a biasing in-plane field $H_{ip}$. The direction of the generated in-plane field is opposite to the sense of a Bloch line 31. Therefore, when the stripe magnetic domain 1 passes under the conductor 13, the Bloch line 31 is blocked, whereupon it is fixed to the left side of the conductor 13 as shown in FIG. 9B. Thus, the magnetized state of the end part of the stripe magnetic domain 1 becomes the same as in FIG. 8B. Therefore, Bloch lines 4a and 5b are subsequently formed in the same way as in FIGS. 8C and 8D. When the stripe magnetic domain 1 is thereafter contracted, the three Bloch lines 4a, 5b and 31 come to exist at the end part thereof, and the intended writing process ends.

With this embodiment, a Bloch line pair can be written into the end part of the stripe magnetic domain as desired, by utilizing a quasi-static repulsive force with a magnetic bubble likewise to the embodiment of FIGS. 8A–8D.

Even when, in the embodiment of FIGS. 8A–8D, the end part of the stripe magnetic domain 1 is not moved, the present invention can be performed if the writing conductor 14 overlaps the stripe magnetic domain 1 at The embodiments have been described as to the case of the magnetic material with which the width of the stripe magnetic domain 1 is about 5 μm. When a material with which the width is less than 5 μm is used, the width of the conductor 10 may be reduced. In addition, although the distance between the conductor and the magnetic garnet film should preferably be shorter, it has been experimentally verified that the present invention can be performed even when the distance is set to, at most, 2 μm or so.

It has also been acknowledged that, when a magnetostriction is afforded underneath the writing conductor so as to slightly turn a perpendicular magnetic anisotropy toward the upper surface of the film, the minimum current required for writing can be lowered.

The lower limit of the writing current is determined by a magnetic field under which the Bloch point is injected. Thus, the lower limit lowers with the narrower conductor because an intenser field is locally applied. However, a large amount of current cannot be caused to flow due to electromigration etc. (the upper limit was about 500 mA). Therefore, the conductor width should preferably lie within a range of about 0.5–5 $\mu$m. The embodiments can attain a wide operating margin within this range of conductor widths.

We claim:

1. A Bloch line memory device comprising:
    a magnetic film which holds magnetic bubble domains;
    a stripe magnetic domain which is formed within said magnetic film, and which has Bloch line pairs as information carriers;
    a single conductor which is disposed on said magnetic film so as to cross a magnetic wall of said stripe magnetic domain; and
    means for causing current to flow through said single conductor so as to establish an in-plane field in a sense opposite to that of magnetization in said magnetic wall of said stripe magnetic domain, thereby to write the Bloch line pair into said magnetic wall of said stripe magnetic domain.

2. A Bloch line memory device according to claim 1, wherein the Bloch line pair is written by utilizing a phenomenon in which a Bloch point is injected just under the single writing conductor.

3. A Bloch line memory device according to claim 1, wherein the current lies within a range from 10 mA to 500 mA.

4. A Bloch line memory device according to claim 1, wherein the single writing conductor has a width within a range from 0.5 $\mu$m to 5 $\mu$m.

5. A Bloch line memory device according to claim 1, wherein senses of magnetization within upper and lower sides of the magnetic wall of said stripe magnetic domain underlying said single conductor are opposite to each other.

6. A Bloch line memory device according to claim 1, wherein when senses of magnetization within upper and lower sides of the magnetic wall of said stripe magnetic domain underlying said single conductor are identical to each other, a conductor width of said single conductor on one of the sides of the magnetic wall of said stripe magnetic domain is greater than a conductor width on the other side.

7. A Bloch line memory device comprising:
    a magnetic film which holds magnetic bubble domains;
    a stripe magnetic domain which is formed within said magnetic film, and which has Bloch line pairs as information carriers;
    means for stretching said stripe magnetic domain in a lengthwise direction thereof;
    a single conductor which is disposed on said magnetic film so as to cross a magnetic wall of the stripe magnetic domain stretched by the stretching means; and
    means for causing current to flow through said single conductor so as to establish an in-plane field in a sense opposite to that of magnetization in said magnetic wall of said stripe magnetic domain, thereby to write the Bloch line pair into said magnetic wall of said stripe magnetic domain.

8. A Bloch line memory device according to claim 7, wherein senses of magnetization within upper and lower sides of the magnetic wall of said stripe magnetic domain underlying said single conductor are opposite to each other.

9. A Bloch line memory device according to claim 7, wherein said stripe magnetic domain has a Block line at an end part thereof, and further comprising holding means for holding the Bloch line during the stretching by the stretching means and for rendering senses of magnetization within upper and lower sides of the magnetic wall of said stripe magnetic domain under said single conductor, opposite to each other.

* * * * *